United States Patent [19]

Hashinaga et al.

[11] Patent Number: 5,406,212
[45] Date of Patent: Apr. 11, 1995

[54] BURN-IN APPARATUS AND METHOD FOR SELF-HEATING SEMICONDUCTOR DEVICES HAVING BUILT-IN TEMPERATURE SENSORS

[75] Inventors: Tatsuya Hashinaga; Masanori Nishiguchi, both of Yokohama, Japan

[73] Assignee: Sumitomo Electric Industries, Ltd., Osaka, Japan

[21] Appl. No.: 914,563

[22] Filed: Jul. 17, 1992

[30] Foreign Application Priority Data

| Jul. 19, 1991 | [JP] | Japan | 3-179774 |
| Jul. 26, 1991 | [JP] | Japan | 3-187881 |
| Jul. 29, 1991 | [JP] | Japan | 3-189019 |
| Jul. 30, 1991 | [JP] | Japan | 3-190030 |
| Jul. 30, 1991 | [JP] | Japan | 3-190053 |
| Jul. 31, 1991 | [JP] | Japan | 3-192283 |
| Jul. 31, 1991 | [JP] | Japan | 3-192286 |

[51] Int. Cl.$^6$ ............................................. G01R 1/04
[52] U.S. Cl. ...................................... 324/760; 324/765
[58] Field of Search ............... 324/158 T, 158 F, 760, 324/765; 219/209–210

[56] References Cited

U.S. PATENT DOCUMENTS

| 3,092,998 | 6/1963 | Barton | 324/158 T |
| 4,145,620 | 3/1979 | Dice . | |
| 4,497,998 | 2/1985 | West | 219/210 |
| 4,636,725 | 1/1987 | Santomango et al. | 324/158 F |
| 4,734,641 | 3/1988 | Byrd, Jr. et al. . | |
| 4,745,354 | 5/1988 | Fraser | 324/158 F |
| 4,881,591 | 11/1989 | Rignall | 324/158 F |
| 4,902,969 | 2/1990 | Gussman | 324/158 R |
| 5,001,423 | 3/1991 | Abrami et al. | 324/158 F |
| 5,047,711 | 9/1991 | Smith et al. | 324/158 P |
| 5,233,161 | 8/1993 | Farwell et al. | 219/209 |
| 5,309,090 | 5/1994 | Lipp | 324/158 R |

FOREIGN PATENT DOCUMENTS 0283778 9/1988 European Pat. Off. .
8701813 3/1987 WIPO .

OTHER PUBLICATIONS

Anonymus, "Method to Determine Substrate Potential and Chip Temperature", Research Disclosure, No. 311, Mar. 1990, p. 191.

Delettrez et al, "Thermal Characterization of Power MOSFETS. Results Obtained with the IRF 250", Proceedings of the European Space Power Conference, Oct. 1989, pp. 71–77.

C. C. Yu, "Self-Healing Test Chip for Reliability Life Test". IBM Technical Disclosure Bulletin, vol. 25, No. 7B, Dec. 1982, p. 3651.

G. Siva Bushanam et al., "Measuring Thermal Rises due to Digital Device Overdriving" (The Three Faces of Test: Design, Characterization, Production), International Test Conference 1984 Proceedings, Oct. 1984, pp. 400–423.

D. C. Banker, M. A. Battista, S. C. Chen, Sense Diode, IBM Technical Disclosure Bulletin, Mar. 1981, vol. 23 No. 10, pp. 4497–4498.

C. Delettrez, H. J. N. Spruyt, Thermal Characterization of Power MOS-FETS, Results Obtained With The IRF-25-., Europearn Space Agency SP-294, Aug. 1989, vol. 1, pp. 71–77.

Patent Abstracts of Japan, vol. 6, No. 99, Feb. 19, 1992.

*Primary Examiner*—Kenneth A. Wieder
*Assistant Examiner*—B. Bowser
*Attorney, Agent, or Firm*—Cushman Darby & Cushman

[57] ABSTRACT

A burn-in apparatus for use in burn-in tests includes a burn-in test chamber for accommodating a plurality of semiconductor devices to be tested. The burn-in apparatus further includes measuring means for detecting electric characteristics of temperature sensors built in semiconductor devices to measure junction temperatures of the semiconductor chips built in the semiconductor devices. Based on outputs of the measuring means, control means controls electric power feed amounts to the integrated circuits of the semiconductor chips and/or environmental temperatures in the burn-in test chambers. Thus, the junction temperatures are maintained in a set temperature range, and accuracy of screening tests can be improved.

23 Claims, 15 Drawing Sheets

BURN-IN APPARATUS AND METHOD FOR SELF-HEATING SEMICONDUCTOR DEVICES HAVING BUILT-IN TEMPERATURE SENSORS

BACKGROUND OF THE INVENTION

1. Field of the Invention

This invention relates to a burn-in apparatus and method which is used in burn-in tests (high temperature operating tests) in which temperature loads and electric loads are applied during the testing of semiconductor devices.

2. Related Background Art

Burn-in tests are essential to the life estimating of semiconductor devices, and to the detection of infant mortality or early lifetime failures in screening processes. Generally, a burn-in test is conducted using burn-in boards 10 of FIG. 1 and a burn-in test chamber 12 of FIG. 2. Each burn-in board 10 includes a board 14 of a heat resistant resin or the like. This board 14 has a plurality of sockets 16 provided thereon for receiving DUTs (devices under test) or semiconductor devices (not shown), and external terminals 18 provided on one end of the board 14 for the electrical contact to the outside. The board 14 has a handle 20 provided on the opposite end for the manipulation of the burn-in board 10 by an operator. The terminals (not shown) of the sockets 16 are connected to the external terminals 18 by wirings 22 (partially shown in FIG. 1) on the board 14.

Such burn-in boards 10 are set in the burn-in test chamber 12 as shown in FIG. 2, More specifically, the burn-in test chamber 12 comprises a box body 24 as a main body, a lid 26 attached to the box 24 by a hinge mechanism 28, and a board connector 30 provided in the box body 24. The board connector 30 has slits 32 for receiving the boards 14 of the burn-in board 10. When the boards 14 are inserted into the slits 32 of the board connector 30, the external terminals 18 of the burn-in boards 10 and the terminals (not shown) of the board connector 30 are connected. Through this connection, an electric power is supplied to the semiconductor devices by a power supply means (not shown). Although not shown, the burn-in test chamber 12 includes a temperature adjusting means. The temperature adjusting means is generally in the form of a means for supplying heated air into the interior of the burn-in test chamber 12, or in the form of a heating means.

An interior temperature of the burn-in test chamber 12, i.e., an environmental temperature $T_a$ of the atmosphere surrounding the semiconductor devices is measured by a temperature sensor (not shown) disposed near the inner surface of the wall of the box 24. Conventional burn-in tests have been conducted by controlling the temperature adjusting means while monitoring measured temperatures (MIL-STD 883). But for the following reasons, such conventional art is insufficient to properly conduct the burn-in tests.

In the conventional art, what can be monitored real time is an environmental temperature $T_a$ of semiconductor devices, and this environmental temperature $T_a$ does not agree with a surface temperature of the semiconductor chips constituting the semiconductor devices, especially with junction temperatures $T_j$ at the pn junctions or Schottky junctions of the semiconductor chips. Since failures of semiconductor devices depend on these junction temperatures $T_j$, for the efficient estimation of lives of semiconductor devices and the efficient detection of early lifetime failures of semiconductor devices without applying overloads to proper devices, it is preferable to conduct burn-in tests within a set junction temperature $T_j$ range. In the conventional burn-in tests, a junction temperature $T_j$ is estimated based on a measured environmental temperature $T_a$, and burn-in tests is conducted based on the estimated junction temperature. But it needs very complicated operations to check relationships between an environmental temperature $T_a$ and a junction temperature $T_j$, and different estimating operations are needed in accordance with different sizes types and specifications of semiconductor devices to be tested. Accordingly, it has been difficult to conduct simple burn-in tests with high precision. Additionally, the environmental temperature $T_a$ varies depending on locations in the burn-in test chamber 12, and heat generation amounts of respective semiconductor devices to be tested are not the same either. Therefore, it has not been easy to screen a number of semiconductor devices under uniform conditions.

SUMMARY OF THE INVENTION

An object of this invention is to provide a burn-in apparatus and method which can control, with high precision, junction temperatures of the semiconductor chips of a plurality of semiconductor devices which are burn-in tested at the same time, and can conduct accurate screening tests.

To achieve this object, a burn-in apparatus according to this invention comprises: at least one burn-in board for mounting a plurality of semiconductor devices having semiconductor chips built in; a burn-in test chamber for accommodating the burn-in board; electric power supplying means for supplying an electric power to the respective semiconductor chips; measuring means for detecting electric characteristics of temperature sensors formed on at least a part of the semiconductor chips to measure junction temperatures of said at least a part of the semiconductor chips; and control means for controlling the electric power supplying means, based on outputs of the measuring means.

In this arrangement, the heat generation amounts of the semiconductor chips can be suitably controlled to maintain the junction temperatures within a desired range.

Also, this invention is directed to a burn-in method comprising: the step of positioning at least one burn-in board with a plurality of semiconductor devices in a burn-in test chamber, the semiconductor devices incorporating semiconductor chips; the step of supplying an electric power to the semiconductor chips; the step of detecting electric characteristics of temperature sensors formed on at least a part of semiconductor chips to measure junction temperatures of said at least a part of the semiconductor chips; and the step of controlling electric power supplied to the semiconductor chips, based on measured results of the junction temperatures.

According to another aspect of this invention, a burn-in apparatus comprises: at least one burn-in board for mounting a plurality of semiconductor devices having semiconductor chips built in; a burn-in test chamber for accommodating the burn-in board; temperature adjusting means provided in the burn-in test chamber for adjusting an environmental temperature in the burn-in test chamber; measuring means for detecting electric characteristics of temperature sensors formed on at least a part of the semiconductor chips to measure junction temperatures of said at least a part of the semiconductor chips; and control means for controlling the temperature adjusting means, based on outputs of the measuring means.

By suitably controlling the environmental temperature in the burn-in test chamber on the basis of the measured junction temperatures of the respective semiconductor devices, the junction temperature can be maintained within a desired temperature range.

Also, this invention involves a burn-in method comprising: the step of positioning at least one burn-in board with a plurality of semiconductor devices in a burn-in test chamber, the semiconductor devices incorporating semiconductor chips; the step of detecting electric characteristics of temperature sensors formed on at least a part of the semiconductor chips to measure junction temperatures of said at least a part of the semiconductor chips; and the step of controlling an environmental temperature in the burn-in test chamber, based on measured results of the junction temperatures.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

In the course of the following detailed description, reference will be made to the attached drawings in which.

DETAILED DESCRIPTION OF THE PREFERRED EMBODIMENT

Figure 1:
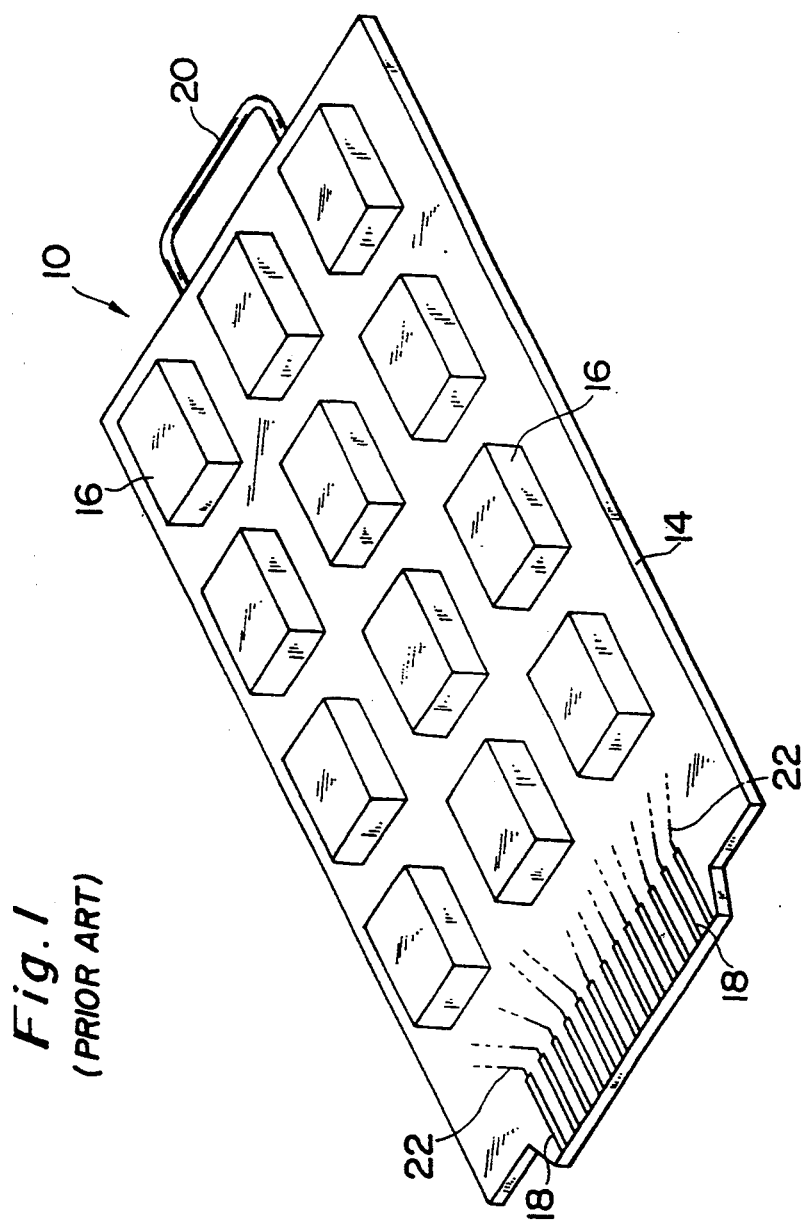
FIG. 1 is a perspective view of the typical burn-in board used in burn-in tests.

In the following description, like reference numerals designate like or corresponding parts throughout the several views.

Figure 2:
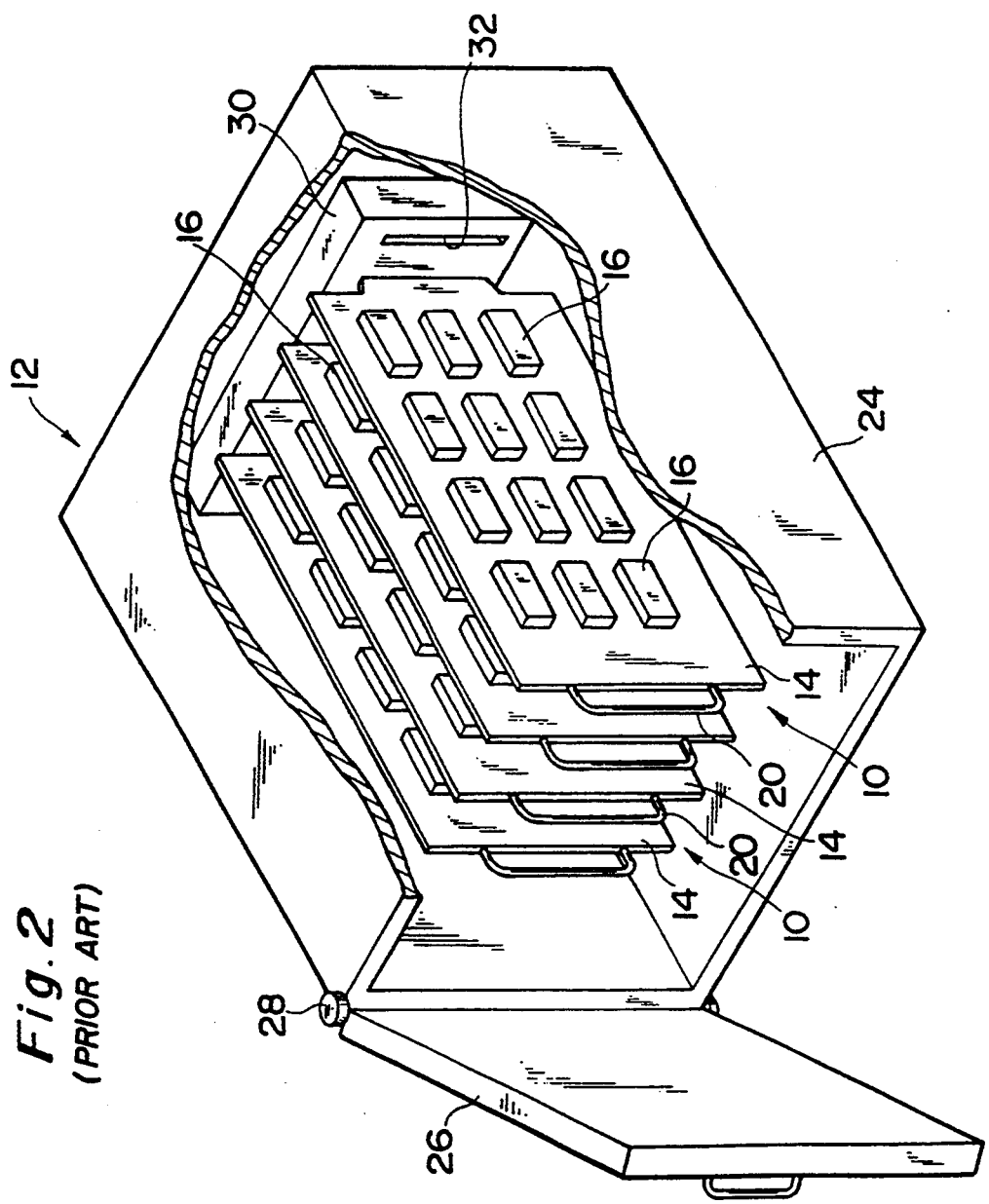
FIG. 2 is a partially broken perspective view of a burn-in test chamber with a plurality of the burn-in boards disposed therein.
Figure 3:
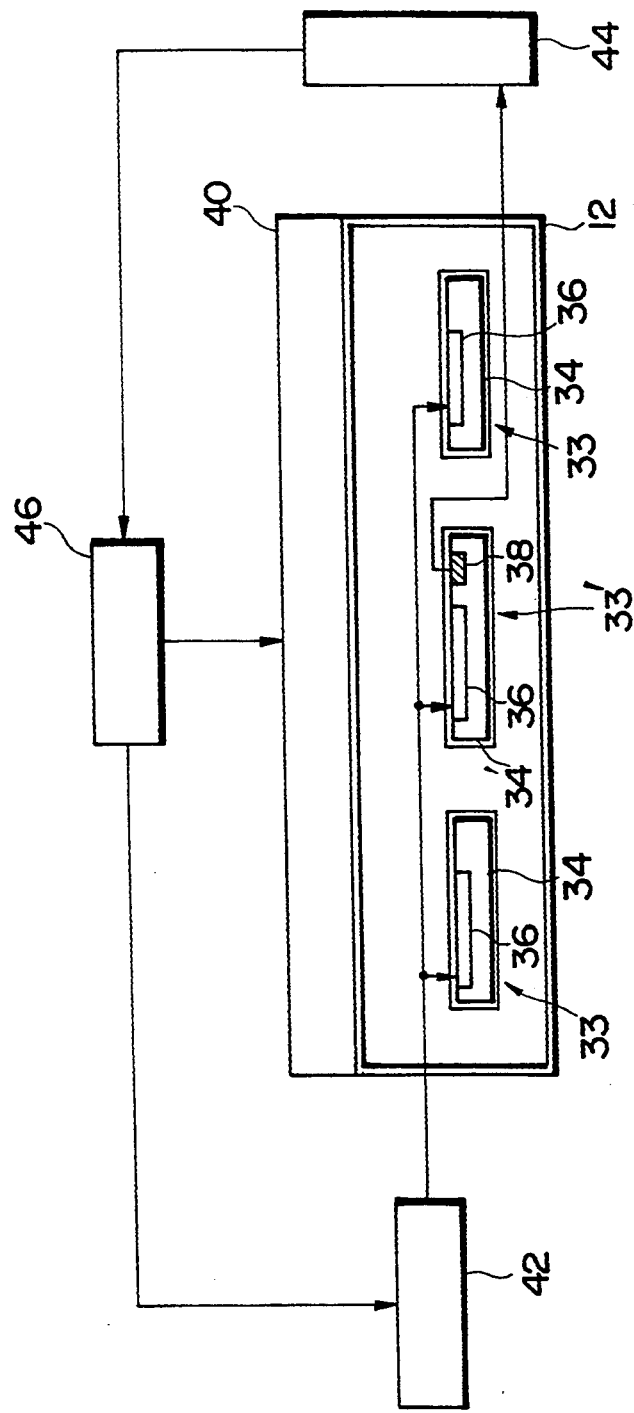
FIG. 3 is a schematic view of the burn-in apparatus according to a first embodiment of this invention.

FIG. 3 is a schematic view of the burn-in apparatus according to a first embodiment of this invention. The burn-in apparatus according to the first embodiment comprises the same burn-in test chamber 12 including a box body and a lid as the above-described conventional burn-in test chamber (see FIG. 2). In the burn-in test chamber 12, there is provided a temperature adjusting unit 40 for adjusting an environmental temperature in the burn-in test chamber 12 by blowing heated air, or heating by a heater.

In this burn-in test chamber 12, a plurality of burn-in boards (not shown) are disposed, and a plurality of semiconductor devices 33, 33' are mounted on each burn-in board by means of sockets (not shown).

Figure 4:
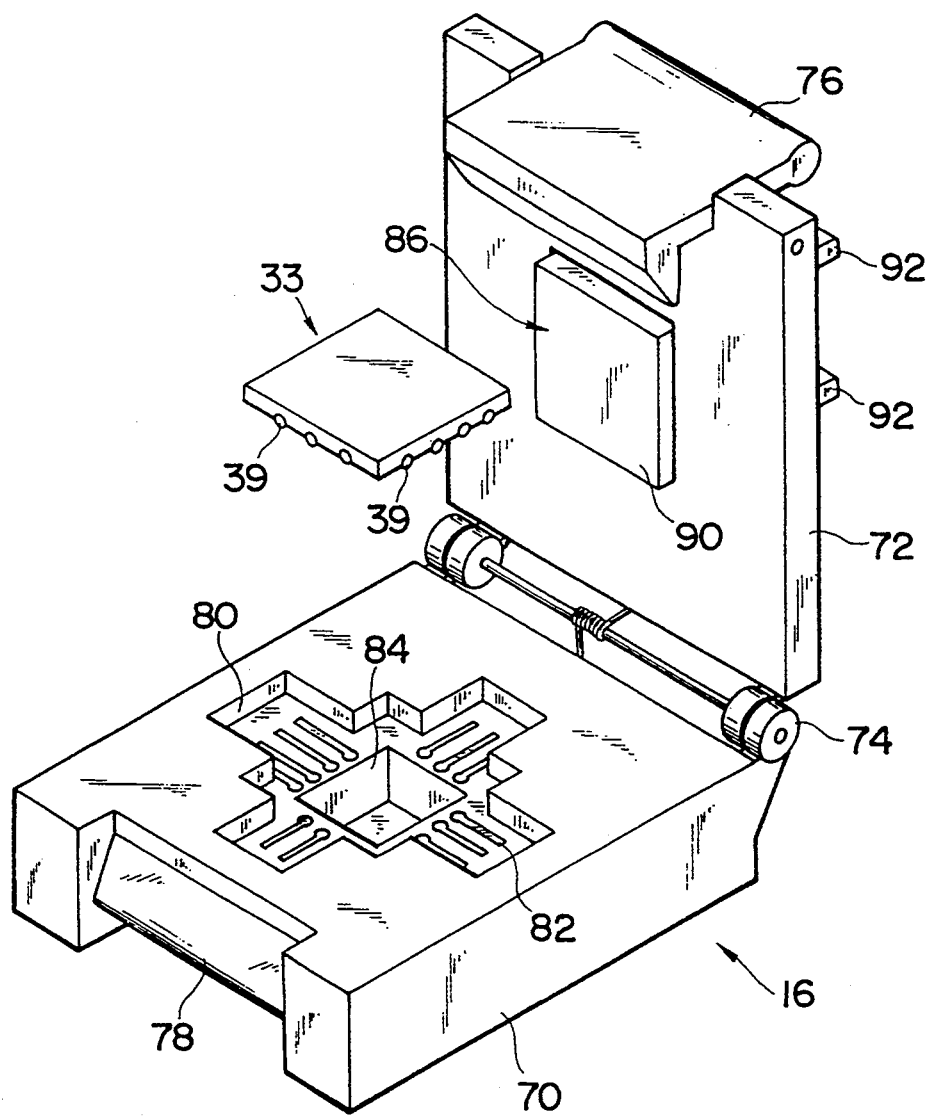
FIG. 4 is a perspective view of a socket for receiving a semiconductor device.
Figure 5:
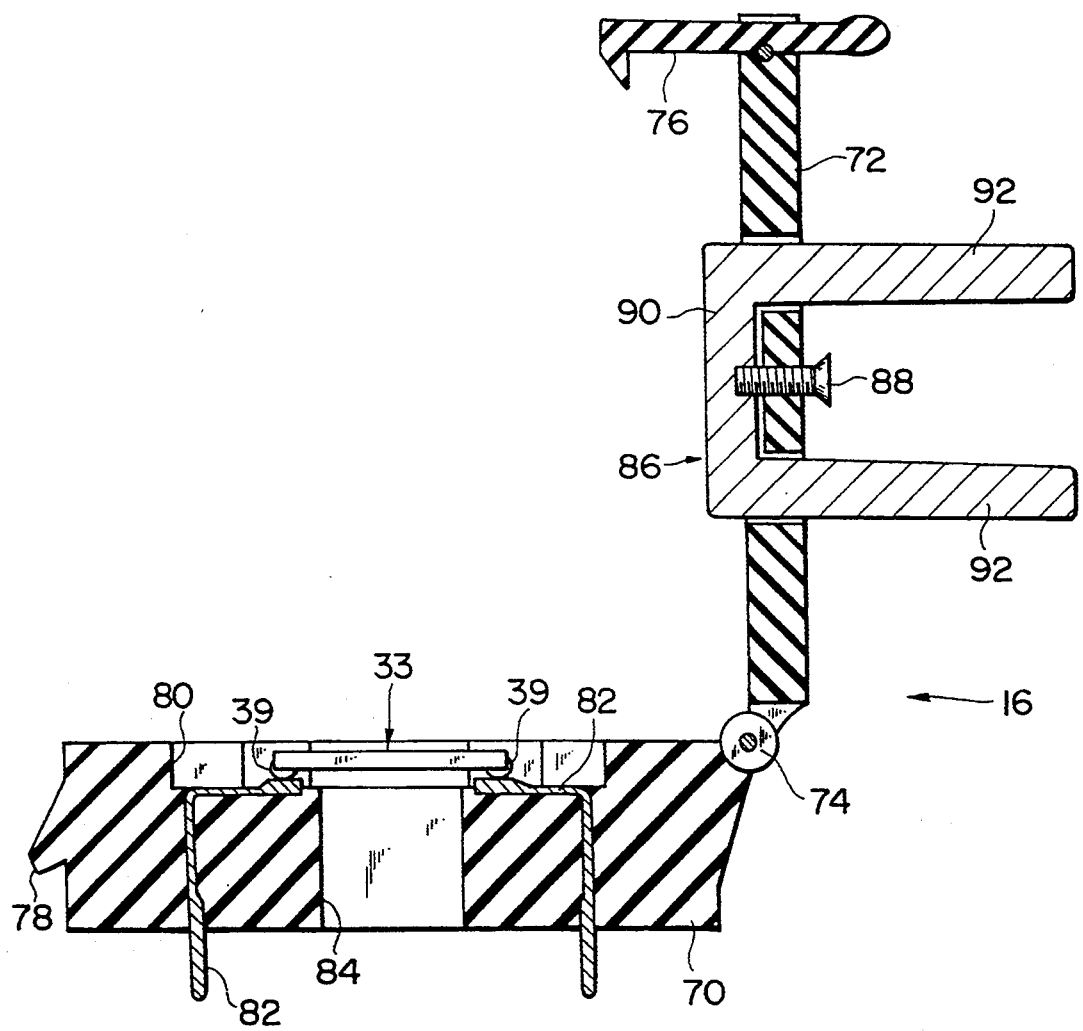
FIG. 5 is a sectional view of the socket of FIG. 4.

Any suitable socket for setting the semiconductor device on the burn-in board 10 can be used. FIGS. 4 and 5 show a preferred example of a socket 16 for setting the semiconductor device 33 on the burn-in board 10. Each socket 16 fixed on the burn-in board comprises a base 70 and a lid 72 connected to the base 70 openably by a hinge 74. When a lever 76 attached to the lid 72 is locked with a hook 78 formed on the base 70, the base 70 is closed by the lid 72. In the central portion of the base 70, there is formed a cross-shaped concavity 80. Electrical connections are formed by a plurality of terminals 82 provided on the bottoms of the arm portions of the concavity 80. One end of the respective terminals 82 are projected from the underside of the base 70 to be connected to the wirings (not shown) on the burn-in board 10. A through-hole 84 is formed in the central portion of the cross-shaped concavity 80. A heat conducting member 86 is secured by a screw 88 to the central portion of the lid 72. This member 88 comprises a flat panel 90 on the side of the lid 72 to be opposed to the base 70, and heat radiation panels 92 formed integrally with the flat panel 90 and extended through the lid 72.

The semiconductor device 33 has a plurality of terminals 39 provided on the underside thereof. These terminals 39 are brought into contact with corresponding terminals 82 of the socket 16 when the semiconductor device 33 is mounted in the socket 16. When the semiconductor device 33 is placed in a concavity 80 and the lid 72 is closed, the flat panel 90 of the heat conducting member 86 is brought into contact with the top surface of the semiconductor device 33 so that the heat of the semiconductor device 33 or semiconductor chip 34 can be conducted and radiated.

All the semiconductor devices 33, 33' include semiconductor chips 34 having integrated circuits 36 built in, respectively. In this embodiment, one 33' of the semiconductor devices 33, 33' additionally have a temperature detection diode 38 as a temperature sensor formed on the built-in semiconductor chip 34'. This semiconductor device 33' having the temperature detection diode 38 is set at a position where a highest environmental temperature $T_a$ is present in the burn-in test chamber 12.

The position where a highest environmental temperature $T_a$ is established in the burn-in test chamber 12 is usually an upper location where the heated air tends to stagnate. Accordingly, it is easy to find such location on the basis of positions and shapes of outlet nozzles of the heated air.

In a burn-in test, an electric load is separately applied to the integrated circuits of the respective semiconductor chips 34, 34' by electric power supplying means 42, and electric characteristics (especially changes of a forward voltage (threshold voltage) $V_F$) of the temperature detection diode 38 of the semiconductor chip 34' are monitored by temperature detecting unit 44, so that a junction temperature $T_j$ of the semiconductor chip 34' is measured. The measurement of this junction temperature $T_j$ is conducted in the following way.

In measuring electric characteristics of the temperature detection diode 38, a junction temperature of the temperature detection diode 38 is measured. The heat resistance of the semiconductor chip 34' is sufficiently smaller than heat resistances of its ambient substances (air, or molding materials), and the following relationships are given.

(A junction temperature of the temperature detection diode 38) ≈ (A junction temperature of the integrated circuit 36) = $T_j$ Hereinafter both junction temperatures are represented commonly by $T_j$.

Figure 6:
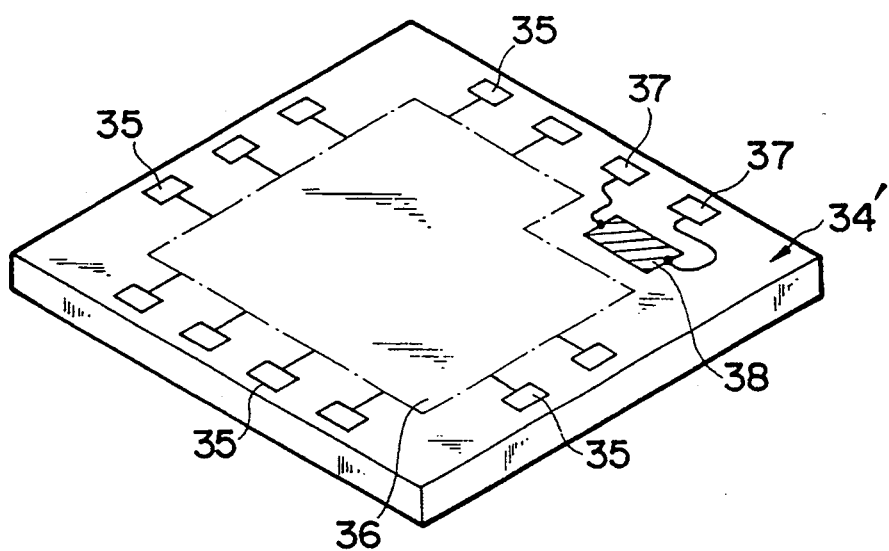
FIG. 6 is a perspective view of a semiconductor chips constituting the semiconductor device.
Figure 7:
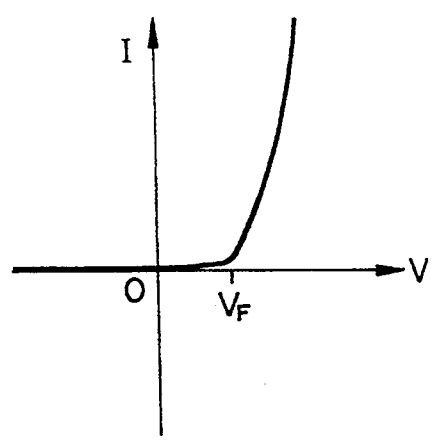
FIG. 7 is an I–V characteristic curve of a temperature detection diode built in the semiconductor chip at a certain temperature.

FIG. 6 shows a perspective view of the semiconductor chip 34' involved in the above-described embodiment. FIG. 7 is a graph of an I-V characteristic of the temperature detection diode 38 at a temperature. As shown in FIG. 6 on the semiconductor chip 34', there are formed the integrated circuit 36, the temperature detection diode 38, a power supply pad 35 connected to the integrated circuit 36 and monitoring pads 37 connected to the anode and the cathode of the temperature detection diode 38. This semiconductor chip 34' is packaged in a flat package or a leadless chip-carrier (LCC) as a semiconductor device 33' to be burn-in tested. The temperature monitoring for this semiconductor chip 34' is based on the observation of an I-V characteristic of the temperature detection diode 38. That is, the forward voltage $V_F$ of the I-V characteristic of FIG. 7 changes substantially linearly with respect to junction temperatures in a range of junction temperatures exhibited in a burn-in test of the semiconductor device. This relationship is approximately expressed by the following Formula 1.

$$V_F \approx TC \cdot T_j + V_{F0} \quad (1)$$

$V_F$: Forward voltage of a temperature detection diode
TC: Temperature coefficient of $V_F$ value
$T_j$: Junction temperature of a semiconductor device or chip to be tested
$V_{F0}$: Constant given for each semiconductor device or chip to be tested A current flowing through the temperature detection diode 38 when a forward voltage $V_F$ is applied thereto is so trivial that the temperature detection diode does not contribute much to increases of a junction temperature. When the forward voltage $V_F$ is measured with the integrated circuit 36 unfed, a junction temperature $T_j$ agrees with an environmental temperature.

Figure 8:
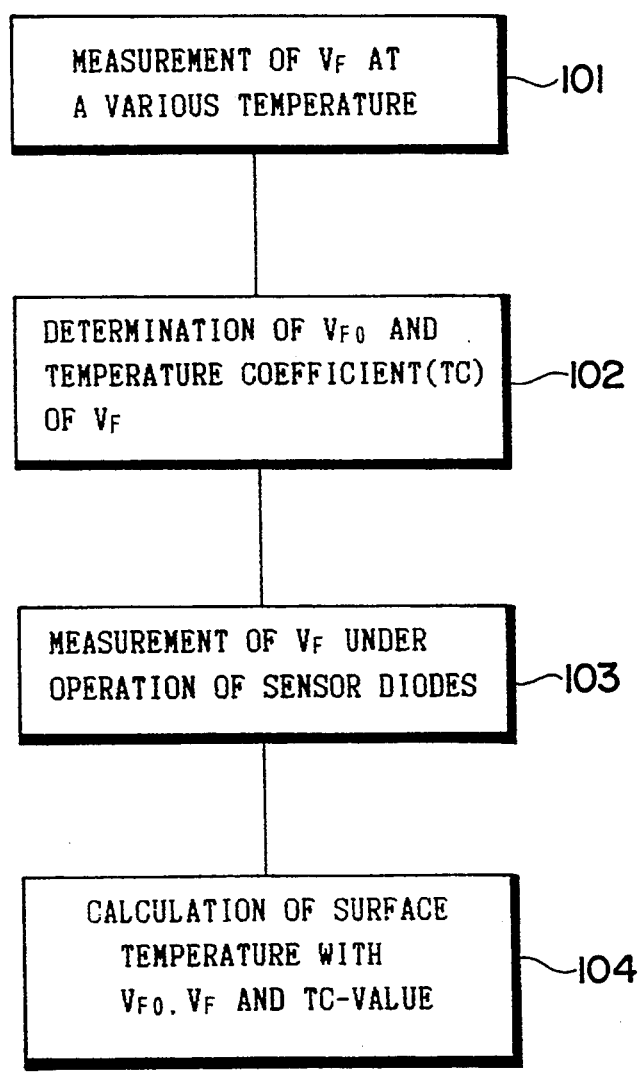
FIG. 8 is a flow chart of a first junction temperature measuring method.

A first temperature measurement technique uses the above-described property, and the flow chart of this technique is shown in FIG. 8. First, values of a forward voltage $V_F$ are measured at different environmental temperatures with the integrated circuit 36 unfed (Step 101). Based on the measured values of the forward voltage and Formula 1, a value of a constant $V_{F0}$ of the forward voltages $V_F$, and a value of a temperature coefficient TC of the forward voltages $V_F$ are given (Step 102). Following this preparation, a burn-in test is started, and during the burn-in test, temperatures of the semiconductor chips 34' are accurately detected. That is, semiconductor chips 34' are mounted on the burn-in apparatus, and while the integrated circuits 36 are in operation with a current supplied to, values of the forward voltages $V_F$ are measured (Step 103). Values of the junction temperatures $T_j$ are given based on the value of the constant $V_{F0}$, the value of the temperature coefficient TC, and measured values of forward voltages $V_F$ (Step 104).

Also the following second junction temperature measurement technique can give measured values of precision as high as the first technique.

Figure 9:
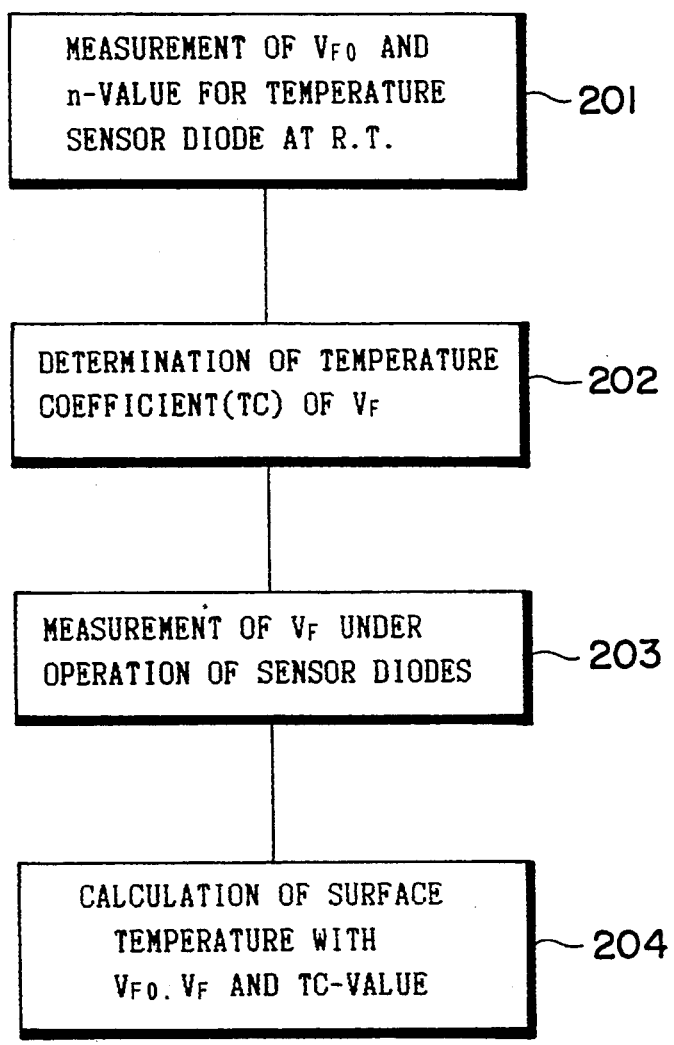
FIG. 9 is a flow chart of a second junction temperature measuring method.

FIG. 9 shows the flow chart of the second junction temperature measurement technique. First, a value of a constant $V_{F0}$ of a temperature detection diode 38 formed on the semiconductor chip 34', and an ideal value n thereof are given at the room temperature (Step 201). Here, a forward current $I_F$ of the Schottky type temperature detection diode 38 is given by the following Formula 2.

$$I_F \approx SA^*T^2 \exp\left(-\frac{q\phi_B}{kT}\right)\exp\left(\frac{qV_F}{nkT}\right) \quad (2)$$

S: Schottky junction area
$A^*$: Effective Richardson constant
T: Absolute temperature
k: Boltzmann constant
q: Electron charge
$\phi_B$: Barrier height
n: Ideal factor A forward threshold voltage $V_F$ of the temperature detection diode 38 and an ideal factor n thereof can be given based on an I-V characteristic of the temperature detection diode 38. A temperature coefficient TC of the temperature detection diode 38 is given by the following Formula 3.

$$TC \equiv \frac{\partial V_F}{\partial T} = \frac{nk}{q}\left(2 - \ln\frac{I_F}{SA^*T^2}\right) \quad (3)$$

Figure 16:
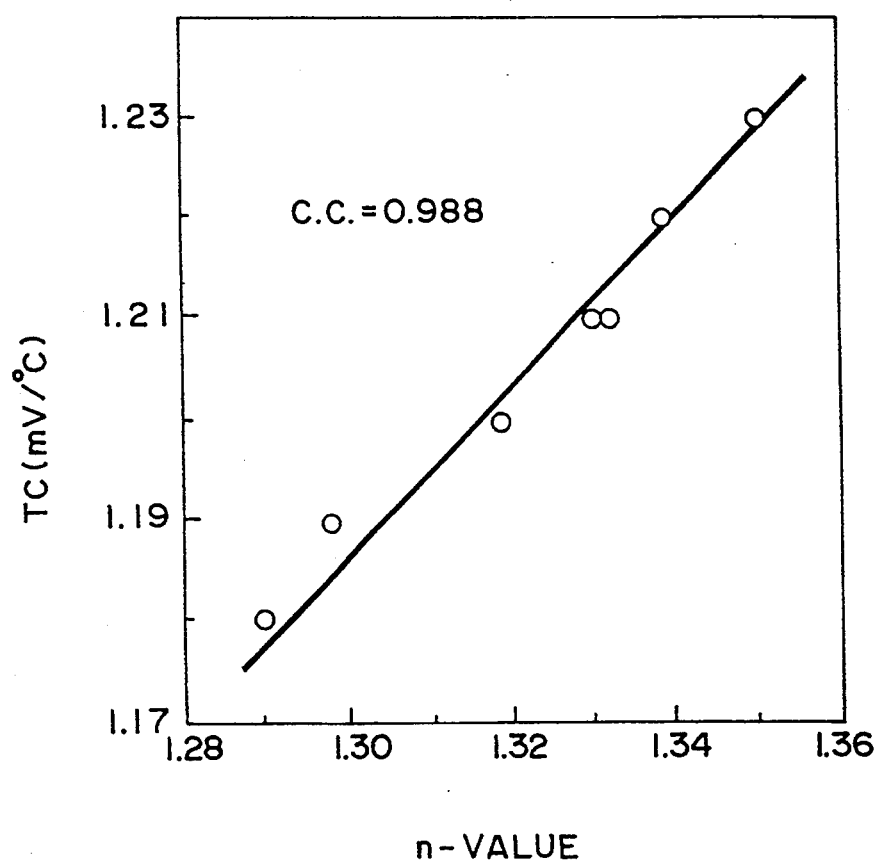
FIG. 16 is a graph of an experimental result of a relationship between TC value and n value.

Variations of a value of the second term in the parentheses of Formula 3 are sufficiently small in the junction temperature range of burn-in tests, so that the TC value is almostly proportional to the n value. This relation between TC and n was confirmed by an experimental result shown in FIG. 16.

A temperature coefficient TC of the forward voltage $V_F$ is given by Formula 1 and 2 (Step 202) to detect an accurate temperature of the semiconductor chip 34' during a burn-in. That is, semiconductor chips 34 are mounted on the burn-in apparatus, and while the integrated circuits 36 are in operation with a current supplied to, values of the forward threshold voltages $V_F$ are measured (Step 203). Then, based on the value of the constant $V_{F0}$ given at the room temperature, the values of the threshold voltages $V_F$ given real time during a burn-in, and a value of the ideal factor n, junction temperatures $T_j$ of the temperature detection diodes 38, i.e., surface temperatures of the semiconductor chips 34', are given real time (Step 204).

Here FIG. 3 is again referred to. The burn-in apparatus according to this invention includes control device 46. This control device 46 controls the electric power supplying unit 42 based on a monitor result of the temperature detecting unit 44 to control electric power feed amounts to the integrated circuits 36 of all the semiconductor chips 34, 34' in an allowable range. To this end, the control device 46 stores an allowable range of the junction temperature $T_j$ for a burn-in test, and is so programmed that the electric power supplying unit 42 is suitably controlled based on a result of a comparison between the stored allowable temperature range and a monitor result.

The method for controlling the electric power supplying unit 42 will be explained in more detail. In the case that the control device 46 recognizes based on a monitor result of the temperature detecting unit 44 that a junction temperature $T_j$ of the semiconductor chip 34' of the semiconductor device 33' has exceeded a set allowable maximum temperature, the electric power amounts supplied to all the semiconductor chips 34, 34' are decreased to lower junction temperatures $T_j$ of the respective semiconductor chips 34, 34 '. A junction temperature $T_j$ of the semiconductor chip 34' with the temperature detection diode 38 is higher than junction temperatures $T_j$ of the other semiconductor chips 34, because the semiconductor chip 34' is located at a position where an environmental temperature is highest. Accordingly, by lowering junction temperatures $T_j$ of all the semiconductor chips 34, 34' as a whole, the semiconductor chips 34, 34' do not have junction temperatures above the allowable temperature range.

Thus, screening test are prevented from being reduced to different purposes, and accurate screening is enabled.

In the above-description, the temperature detection diode 38 is provided on one semiconductor chip 34', but the temperature detection diode 38 may be provided on each of the semiconductor chips 34, and that of the semiconductor chip having a highest junction temperature may be monitored.

Also, as a method for lowering junction temperatures $T_j$, it is possible that the temperature adjusting unit 40 for adjusting an environmental temperature $T_a$ is controlled to lower an environmental temperature $T_a$ as a whole.

Figure 10:
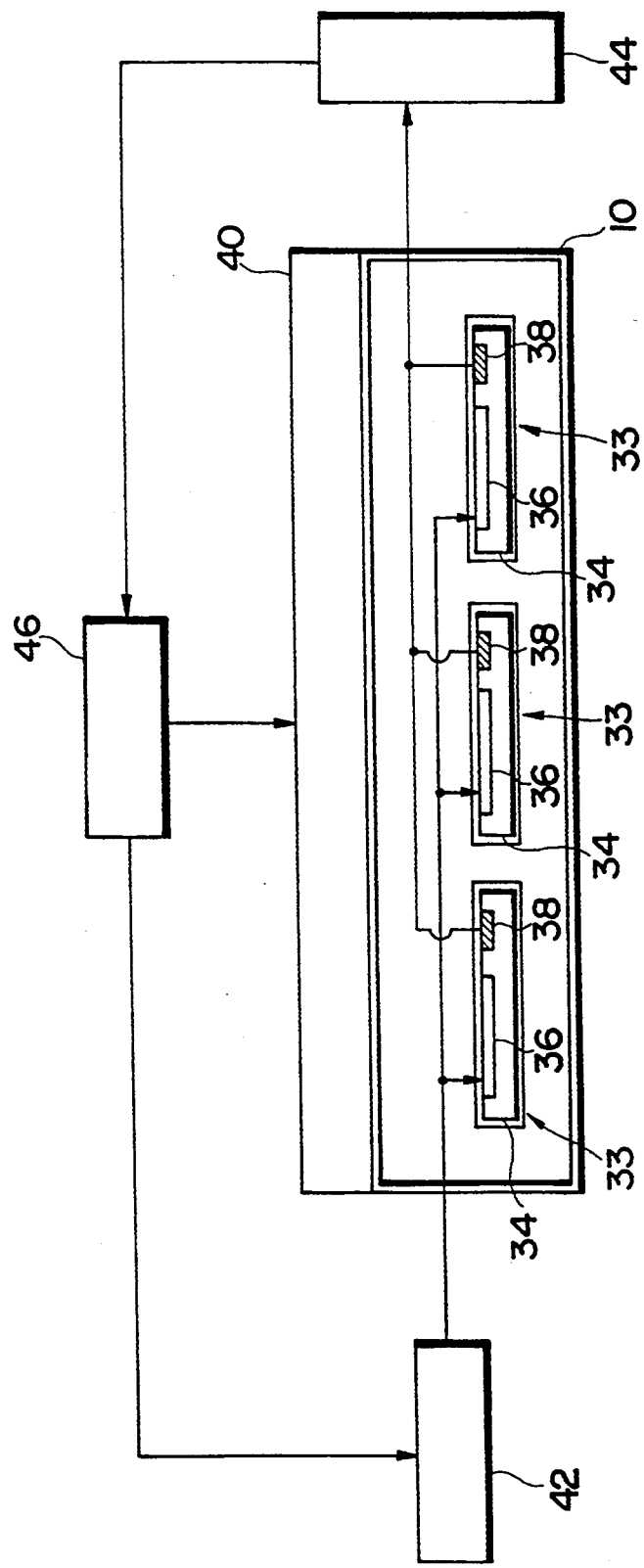
FIG. 10 is a schematic view of the burn-in apparatus according to a second embodiment of this invention.

FIG. 10 is a schematic view of the burn-in apparatus according to a second embodiment of this invention. The second embodiment is the same as the first embodiment except that the temperature detection diode 38 used as the temperature sensor is provided on each of the semiconductor chips 34, and junction temperatures of the respective temperature detection diodes 38 are measured by the temperature detecting unit 44.

In this second embodiment, the control device 46 is programmed so as, when monitored junction temperatures $T_j$ contain a junction temperature outside an allowable temperature range, to control electric power supplying unit 42 to adjust an electric power feed amount to the semiconductor chip 33 having such junction temperature is adjusted.

Figure 11:
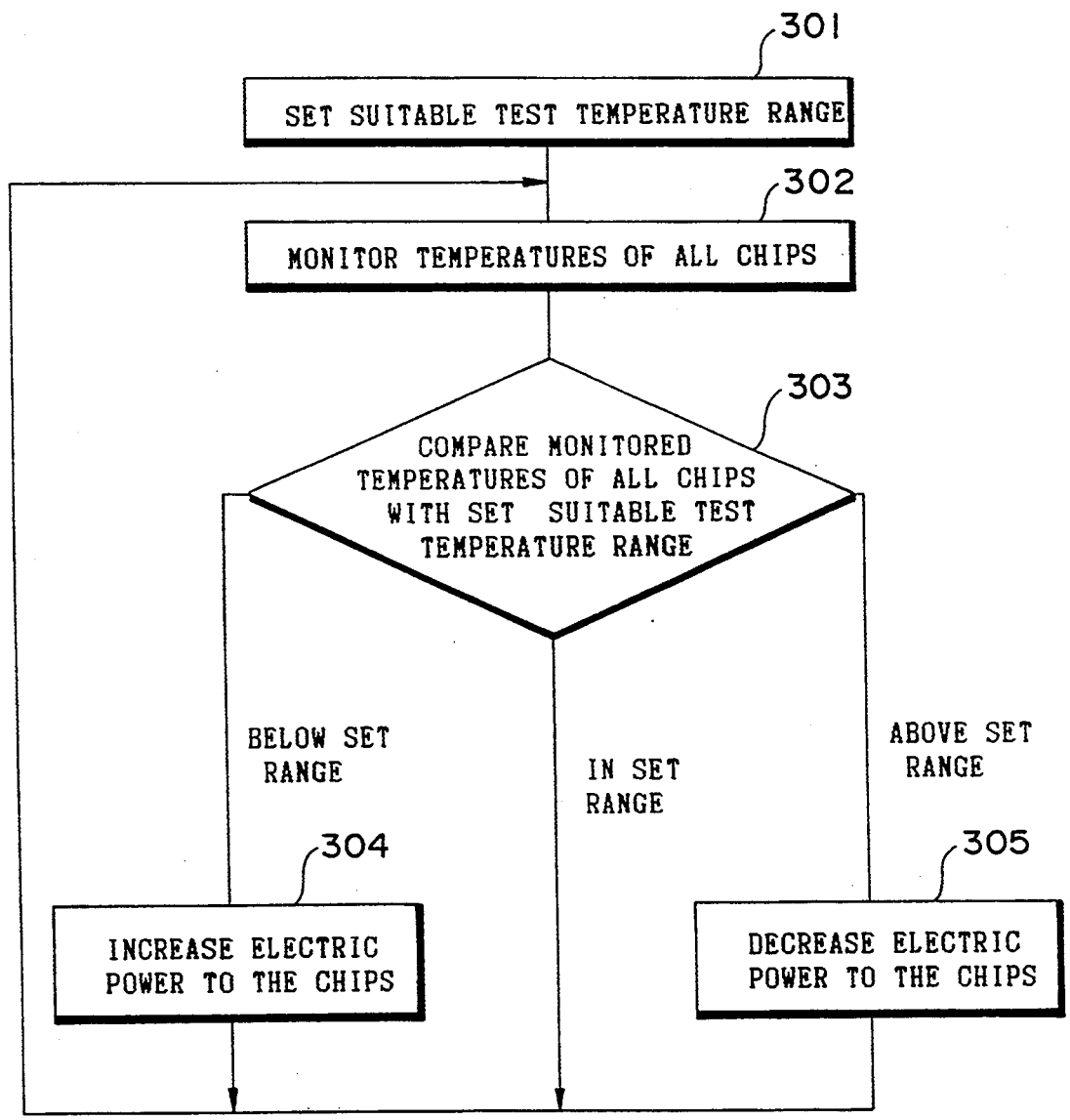
FIG. 11 is a flow chart of a first method for controlling an electric power supplying means used in the burn-in apparatus of FIG. 10.

A method for controlling the electric power supplying unit 46 used in the second embodiment will be explained in more detail with reference to the flow chart of FIG. 11. An allowable junction temperature range or a suitable test temperature is set by an operator and is stored in a memory of the control device 46 (Step 301). When a burn-in test is started, electric characteristics of the respective temperature detection diodes 38 are individually monitored by the temperature detecting unit 44, and junction temperatures $T_j$ of the respective semiconductor chips 34 (Step 302). The actually measured values of the junction temperatures $T_j$ of the respective semiconductor chips 34 and the set allowable temperature range are compared by the control device 46 (Step 303). An electric power supplied to that of the semiconductor chips 34 whose monitored junction temperature is below the set allowable temperature range is increased (Step 304), and an electric power supplied to that of the semiconductor chips whose monitored junction temperature is above the set allowable temperature is decreased (Step 305). For example, in the case a set allowable temperature range is 145°~155° C., if a first semiconductor chip has a junction temperature of 140° C., and a second semiconductor chip has a junction temperature of 160°, an electric power to the first semiconductor chip is increased, and that to the second semiconductor chip is decreased. It should be noted that increases and decreases of an electric power is within an allowable range for a burn-in test. When an electric power is increased, a heat generation amount of the associated integrated circuit 38 is increased, and the junction temperature $T_j$ is raised to the set allowable temperature range. When an electric power is decreased, a heat generation amount of the integrated circuit 38 is decreased, and the junction temperature $T_j$ is lowered to the set allowable temperature range. Steps 302~305 are repeated, whereby the junction temperatures $T_j$ are maintained within the set allowable temperature range.

In the case that junction temperatures $T_j$ of a plurality of semiconductor chips 34 are outside an allowable temperature range as described above, a burn-in test does not have to be conducted at unnecessarily high temperatures, because an electric power feed amount is controlled for the respective semiconductor chips. Accordingly, accurate screening is enabled.

It should be noted that decreases and increases of an electric power feed amount may be made beyond an allowable feed amount range in burn-in tests for the purpose of finding failures which do not depend on electric power feed amounts.

In the second embodiment, the temperature detection diode 38 is formed on each of the semiconductor chips 34, but may be formed on at least two of the semiconductor chips, preferably at a location where an environmental temperature is lowest, and also at a location where the environmental temperature is highest. In this case, it is necessary that junction temperatures of the semiconductor chips at other locations are estimated based on a difference between monitored temperatures of the two semiconductor chips, and based on an estimation result, an electric power is controlled for the respective semiconductor chips.

In the case that the temperature detection diodes 38 are provided on all the semiconductor chips as shown in FIG. 10, the following method for controlling the electric power supplying unit 42 can be applied.

Figure 12:
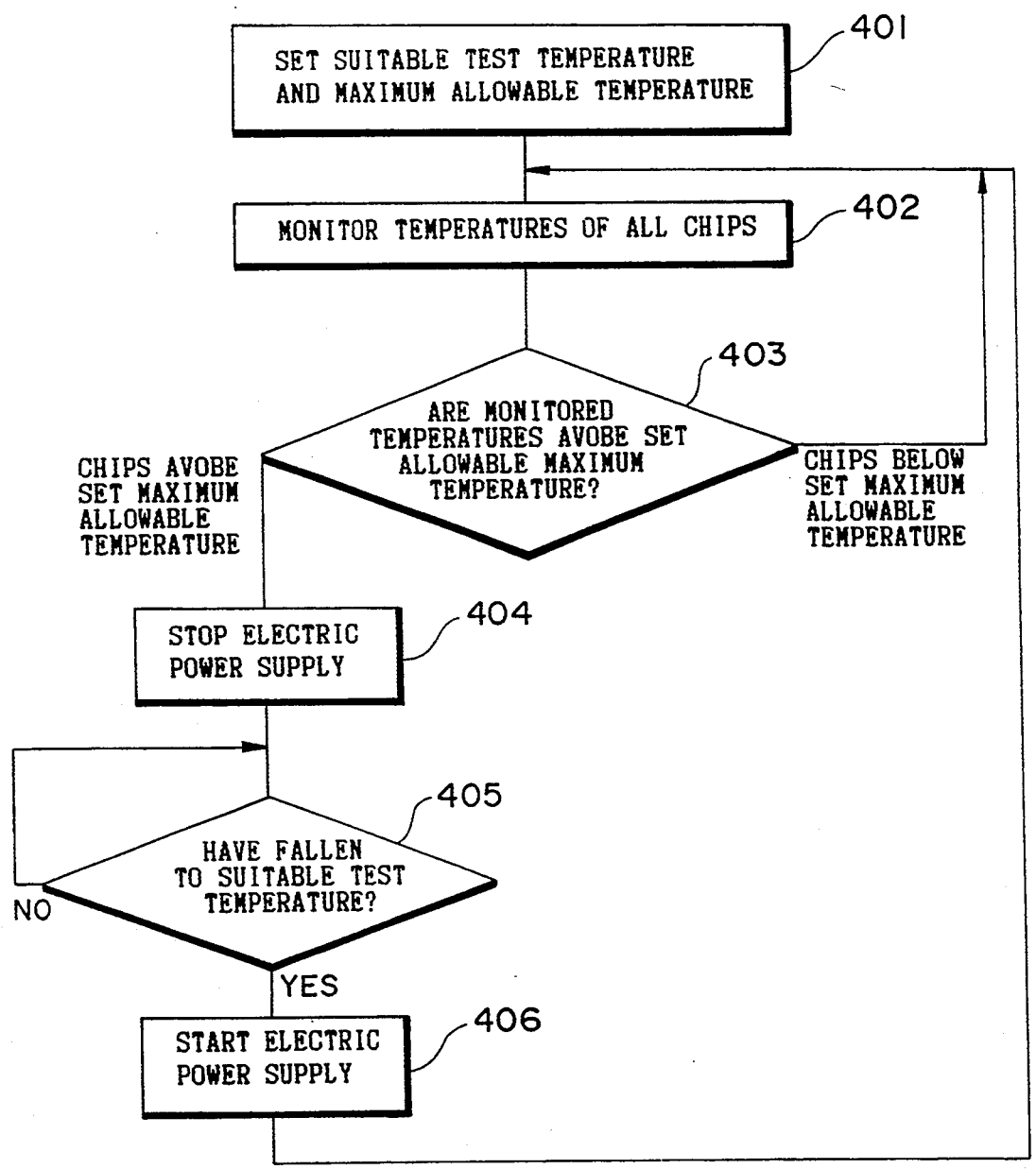
FIG. 12 is a flow chart of a second method for controlling the electric power supplying means used in the burn-in apparatus of FIG. 10.

As shown in the flow chart of FIG. 12, an allowable junction temperature range or a suitable test temperature is set by an operator and is stored in a memory of the control device 46 (Step 401). When a test is started, electric characteristics of respective temperature detection diodes 38 are individually measured, and junction temperatures $T_j$ of the respective semiconductor chips 34 are individually monitored (Step 402). A measured value of the junction temperature $T_j$ of each semiconductor chip 34 is compared with the set allowable temperature range (Step 403). Those of the semiconductor chips 34 whose measured junction temperatures are below the set allowable temperature range are continuously fed with an electric power, and the electric power supply is stopped to those of the semiconductor chips 34 whose measured junction temperatures $T_j$ are above the set allowable temperature range (Step 404). After the electric power supply is stopped, the monitor of the junction temperatures are continued (Step 405). When the junction temperatures $T_j$ have lowered to the set allowable temperature range, the electric power supply is resumed to the semiconductor chips 34 (Step 406). Thus, the ON/OFF of the electric power supply to those of the semiconductor chips whose junction temperatures have risen above the set allowable temperature range is controlled so that a burn-in test is conducted in a suitable temperature range. Accordingly, accurate screening can be conducted. It is preferable that a pause time of the electric power supply is omitted from a time of a screening test, and to this end, it is preferable that a pause time of the electric power supply be individually monitored.

Figure 13:
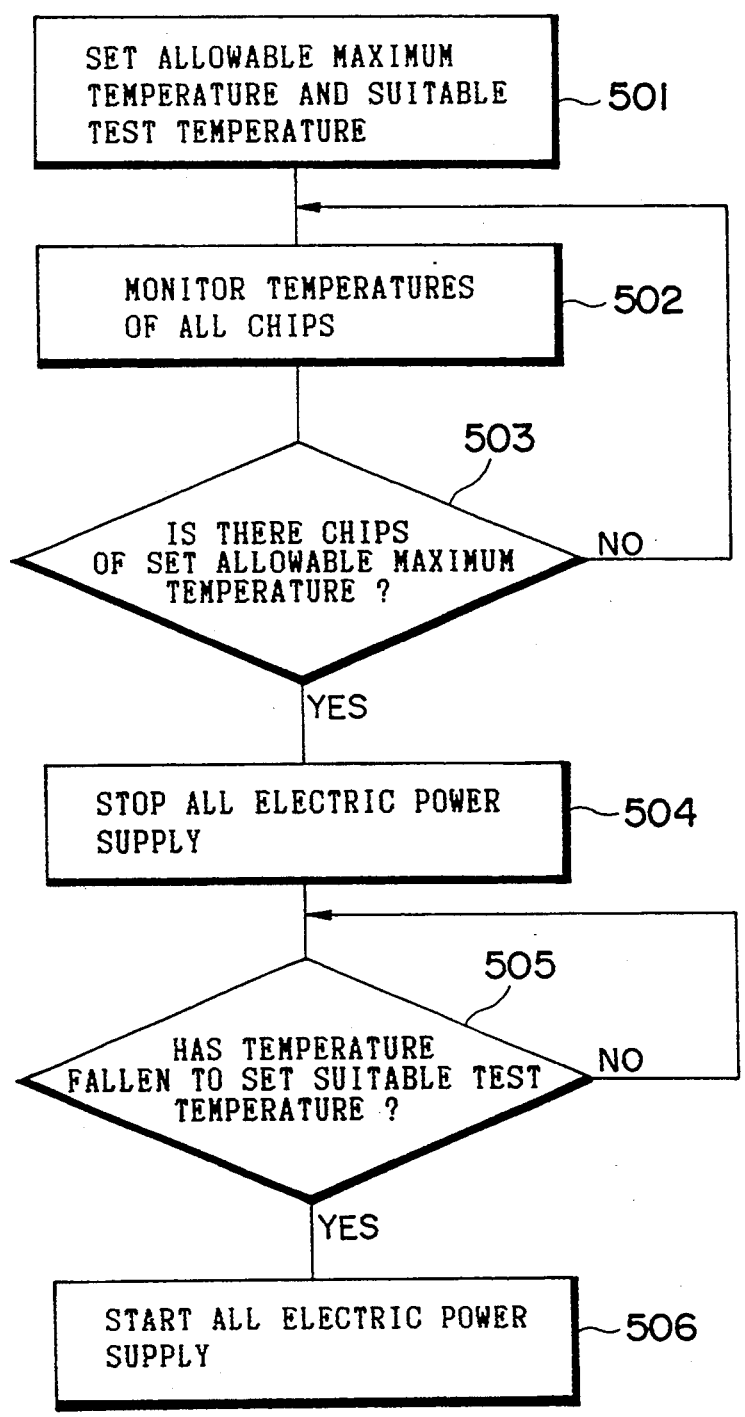
FIG. 13 is a flow chart of a third method for controlling the electric power supplying means used in the burn-in apparatus of FIG. 10.

As shown in the flow chart of FIG. 13, in the case that a junction temperature $T_j$ of one of the semiconductor chips 34 is judged to be above a set allowable maximum temperature (Step 503), it is possible that the electric power supply to all the semiconductor chips 34 are stopped (Step 504). When such high junction temperature has fallen to the set suitable test temperature following a pause of the electric power supply, the electric power supply to all the semiconductor chips 34 is resumed (Steps 505, 506). Since Steps 401 and 402 of the flow chart of FIG. 13 are the same as Steps 401 and 402 of the flow chart of FIG. 14, their explanation is omitted.

Thus, the electric power supply to all the semiconductor chips 34 is paused, whereby a burn-in test is paused. Consequently, a burn-in test is prevented from being reduced to different purposes, and accurate screening is enabled.

In the case that the ON/OFF of the electric power supply to all the semiconductors 34 is controlled, it is not necessary that each of the semiconductor chips 34 has the temperature detection diode 38. Instead, it is possible that the temperature detection diode 38 is formed on the semiconductor chip of a semiconductor device to be set at a location where a high environmental temperature $T_a$ is expected, and the semiconductor chip is monitored.

It is also possible that the temperature adjusting unit 40 is controlled to increase and decrease an environmental temperature $T_a$ in the burn-in test chamber 12, whereby junction temperatures of the semiconductor chips 34 are adjusted.

Figure 14:
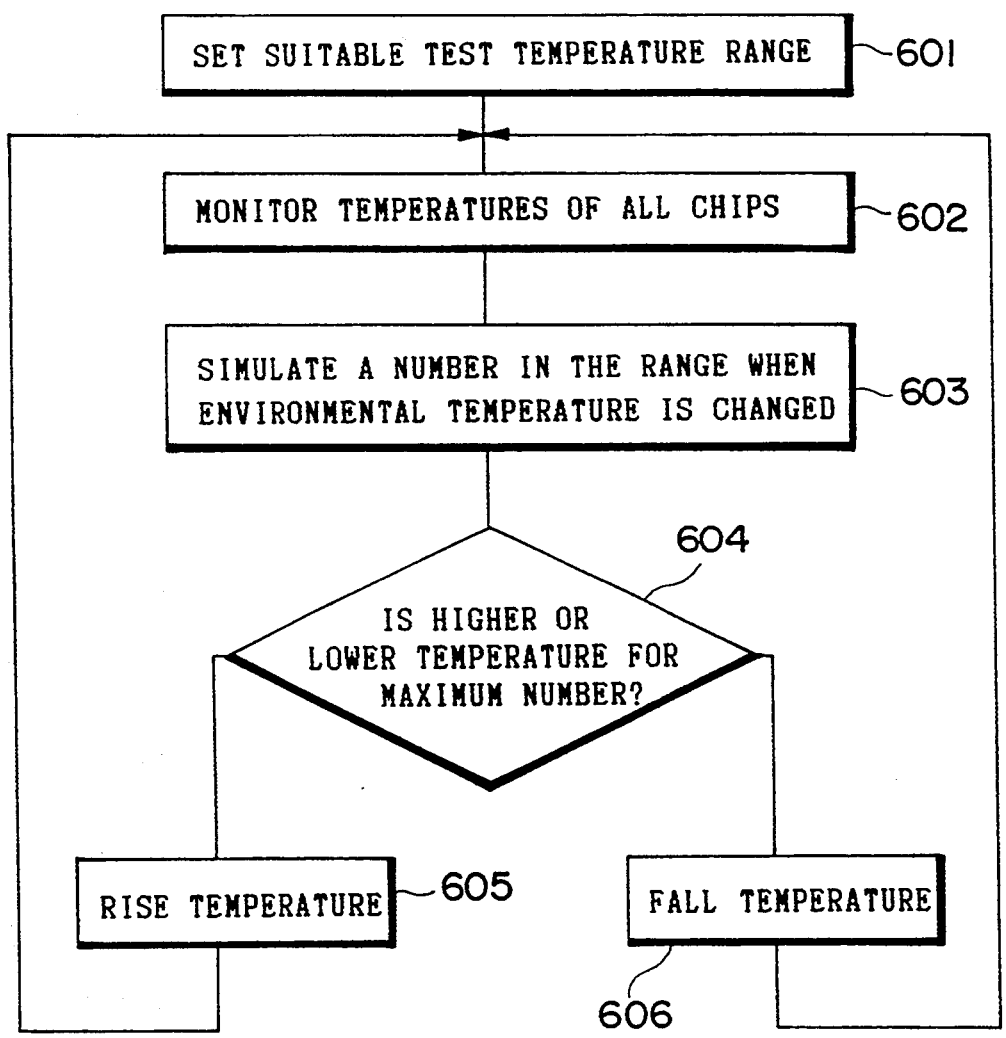
FIG. 14 is a flow chart of a method for controlling temperature adjusting means used in the burn-in apparatus of FIG. 10.

FIG. 14 is a flow chart of such a control method. Similarly with the above-described embodiment, a suitable temperature range for a burn-in test is set by an operator and is stored in a memory of the control device 46 (Step 601). After the test is started, electric characteristics of a plurality of temperature detection diodes 38 are measured to monitor junction temperatures $T_j$ of the respective semiconductor chips 34 (Step 602). The number or ratio of those semiconductor chips 34 whose junction temperatures $T_j$ are outside the set suitable temperature range is measured, and the number or ratio of those semiconductor chips 34 whose junction temperatures $T_j$ fall in the set suitable temperature range when the environmental temperature $T_a$ is changed is simulated (Step 603).

Then, it is checked whether an ideal environmental temperature at which the number or ratio of the semiconductor chips 34 which are within the set suitable temperature range becomes maximum is higher or lower than the present environmental temperature (Step 604). Based on a given temperature condition, the temperature adjusting unit 40 raises the present environmental temperature (Step 605) or lowers the present environmental temperature (Step 606). Steps 605 and 808 are repeated to maintain an ideal condition in which the number of semiconductor chips whose junction temperatures $T_j$ are in the set suitable temperature range.

Figure 15:
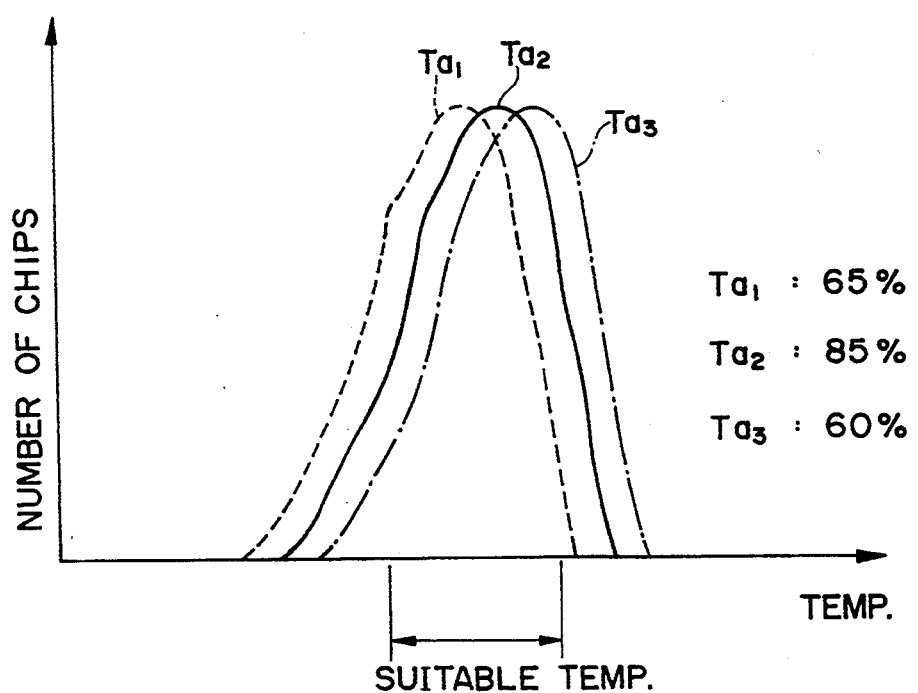
FIG. 15 is a view of a simulation of the method for controlling the temperature adjusting means.

FIG. 15 shows the above-described simulation in a graph. That is, in FIG. 15, the monitored junction temperatures $T_j$ are taken on the horizontal axis, and the numbers of the semiconductor chips are taken on the vertical axis. The numbers or ratios of those of the semiconductor chips whose junction temperatures $T_j$ are in the set suitable temperature range at three environmental temperature ranges $T_{a1}$, $T_{a2}$, $T_{a3}$ are shown. Here it is assumed that at the environmental temperature $T_{a1}$ the ratio is 65%, that at the environmental temperature $T_{a2}$ is 85%, and that at the environmental temperature $T_{a3}$ is 60%. In this case, when the present environmental is $T_{a1}$, the control is conducted to raise this environmental temperature, and when the present environmental temperature is $T_{a3}$, the control is performed to lower this environmental temperature.

Thus, a screening test is prevented from being reduced to a different purpose, and accurate screening is enabled. Since the environmental temperature $T_a$ of the interior of the burn-in test chamber 12 varies at locations in the chamber 12 depending on mounted positions of the temperature adjusting unit 40 or others, some of the semiconductor devices 33 are surrounded by too high temperature, and others are surrounded by too low temperature. In this embodiment, the temperature adjusting unit 40 is controlled so that the largest possible number of the semiconductors have a suitable junction temperature. Accordingly, accurate screening can be conducted.

The junction temperature monitoring does not have to be conducted on all the semiconductor chips, but it is possible to monitor junction temperatures of only those semiconductor chips at locations where a large environmental temperature difference is expected.

The temperature sensors used in this invention are not limited to temperature detection diodes, such as Schottky junction diodes, formed on the semiconductor chips separately from the integrated circuits, and instead may use diodes or transistors built in the integrated circuits. Otherwise, NiCr or WSi metal film resistors may be formed on the semiconductor chips.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A burn-in apparatus for testing semiconductor devices, comprising:
    a burn-in test chamber;
    a burn-in board with a plurality of sockets, each of said sockets for mounting a semiconductor device having a semiconductor chip with a built in temperature sensor, wherein an electric characteristic of said temperature sensor changes in relation to a temperature;
    positioning means provided in said burn-in test chamber for removably positioning said burn-in board at a predetermined location in said burn-in test chamber;
    means for supplying electric power to said semiconductor chip of said semiconductor device mounted on said burn-in board while said burn-in board is positioned in said burn-in test chamber, said electric power supplying means being in communication with said burn-in test chamber so as to supply electric power to said semiconductor chip through said positioning means and said burn-in board;
    measuring means, in communication with said burn-in test chamber, for detecting the electric characteristic of said temperature sensor built into said semiconductor chip, the detection of said electric characteristic occurring through said positioning means and said burn-in board while said semiconductor device is mounted on said burn-in board and said burn-in board is positioned in said burn-in test chamber, with a junction temperature of said semiconductor chip measured on the basis of said detected electric characteristic of said temperature sensor; and
    means for controlling said electric power supply means so as to adjust an electric power amount provided to said semiconductor chip of said semiconductor device mounted on said burn-in board while said burn-in board is positioned in said burn-in test chamber, said control means being responsive to said measuring means so as to adjust said provided electric power amount until said measured junction temperature is in a set temperature range.

2. A burn-in apparatus according to claim 1, wherein:
    said measuring means measures the junction temperature of a semiconductor chip located where an environmental temperature is at a maximum value in said burn-in test chamber; and
    said control means controls said electric power supply means so as to adjust an amount of electric power provided to all semiconductor chips in said burn-in test chamber so that the junction temperature is in a set temperature range.

3. A burn-in test chamber according to claim 1, wherein:
    said measuring means measures junction temperatures of at least two of a plurality of semiconductor chips; and
    said control means controls said electric power supply means so as to selectively adjust an amount of electric power to all of said semiconductor chips so that said measured junction temperatures are in a set temperature range.

4. A burn-in apparatus according to claim 1 wherein:
    said measuring means measures junction temperatures from a plurality of semiconductor chips; and
    said control means controls said electric power supply means so that when one of said junction temperatures is above a maximum temperature of said set temperature range, said supplied electric power to the semiconductor chip having the junction temperature above the maximum temperature is stopped, and when the junction temperature falls in the set temperature range, said supplied electric power to the semiconductor chip is resumed.

5. A burn-in apparatus according to claim 1, wherein:
    said measuring means measures junction temperatures of at least two of a plurality of semiconductor chips; and
    said control means controls said electric power supply means so that when one of said measured junction temperatures is above a maximum temperature of said set temperature range, said supplied electric power to all of said semiconductor chips is stopped, and when said one of said measured junction temperatures falls in said set temperature range, said supplied electric power to all of said semiconductor chips is resumed.

6. A burn-in apparatus according to claim 1, wherein said temperature sensor is a Schottky junction diode formed on said semiconductor chip.

7. A burn-in apparatus according to claim 1, wherein said temperature sensor is a pn junction diode formed on said semiconductor chip.

8. A burn-in apparatus according to claim 1, wherein said temperature sensor is a transistor formed on said semiconductor chip.

9. A burn-in apparatus according to claim 1, wherein said temperature sensor is a metal film resistor formed on said semiconductor chip.

10. A burn-in apparatus according to claim 1, wherein said measuring means applies various voltages to said temperature sensor and measure a voltage value to produce a specific current value, whereby said junction temperature is measured.

11. A burn-in apparatus according to claim 1, further comprising temperature adjusting means for adjusting an environmental temperature in said burn-in test chamber, wherein said control means controls said temperature adjusting means on the basis of said measuring means.

12. A burn-in method for testing semiconductor devices, comprising:
    mounting a plurality of semiconductor devices on a burn-in board, each of said semiconductor devices having a semiconductor chip with a built in temperature sensor, said temperature sensor having an electric characteristic which changes in relation to a temperature;
    positioning said burn-in board at a predetermined location in a burn-in test chamber by a positioning means;
    supplying electric power to said semiconductor chip of each of said semiconductor devices mounted on said burn-in board while said burn-in board is positioned in said burn-in test chamber, said electric power being supplied through said positioning means and said burn-in board;

detecting the electric characteristic of said temperature sensor built into said semiconductor chip of one of said semiconductor devices, said detecting occurring through said positioning means and said burn-in board while said one of said semiconductor devices is mounted on said burn-in board and said burn-in board is positioned in said burn-in test chamber, and measuring a junction temperature of said semiconductor chip on the basis of said detected electric characteristic of said temperature sensor; and controlling said electric power supply so as to adjust an electric power amount provided to said semiconductor chip of each of said semiconductor devices mounted on said burn-in board while said burn-in board is positioned in said burn-in test chamber, said controlling being responsive to said detecting step so as to adjust said electric power amount until said measured junction temperature is in a set temperature range.

13. A burn-in method according to claim 12, wherein:
said detecting step measures the junction temperature of a semiconductor chip located where an environmental temperature is at a maximum value in said burn-in test chamber; and
an electric power supplied to said semiconductor chip of said each of said semiconductor devices in said burn-in test chamber is controlled so that the junction temperature of each chip is in a set temperature range.

14. A burn-in method according to claim 12, wherein:
said detecting step measures junction temperatures of at least two of a plurality of semiconductor chips; and
an electric power supplied to all of said semiconductor chips is selectively controlled so that said measured junction temperatures are in a set temperature range.

15. A burn-in method according to claim 12, wherein:
said detecting step measures junction temperatures from a plurality of semiconductor chips; and
when one of said measured junction temperatures is above a maximum temperature of said set temperature range, said controlling step stops the electric power supply to the semiconductor chip having the junction temperature above the maximum temperature, and when the junction temperature falls in the set temperature range, the electric power supply to said semiconductor chip is resumed.

16. A burn-in method according to claim 12, wherein:
said detecting step measures junction temperatures of at least two of a plurality of semiconductor chips; and
when one of said measured junction temperatures is above a maximum temperature of said set temperature range, said electric power supply to all of said semiconductor chips is stopped, and when said measured junction temperature falls in the set temperature range, said electric power supply to of all of said semiconductor chips is resumed.

17. A burn-in method according to claim 12, further comprising
temperature adjusting means provided in the burn-in test chamber for adjusting an environmental temperature in the burn-in test chamber and said junction temperatures of the semiconductor chips.

18. A burn-in method according to claim 12, wherein said junction temperature is derived from said electric characteristics on the basis of required parameters.

19. A burn-in method according to claim 18, wherein said temperature sensor is comprised of Schottky junction diodes, the parameters deriving a junction temperature thereof are an applied voltage at a specific junction temperature for causing a trifle current of a specific value to flow, and a temperature coefficient of the applied voltage, said parameters determined by measuring at various environmental temperatures with the semiconductor devices unfed for causing the trifle current of the specific value to flow.

20. A burn-in method according to claim 18, wherein said temperature sensor is comprised of Schottky junction diodes, the parameters deriving a junction temperature thereof are an applied voltage at a specific junction temperature for causing a trifle current to flow, and a value of n in the following Formula, said parameters determined by measuring, with the semiconductor devices unfed, applied voltages at the room temperature for causing trifle currents of various values, and using a relationship expressed by the following Formula $$I_F \approx SA^*T^2 \exp\left(-\frac{q\phi_B}{kT}\right)\exp\left(\frac{qV_F}{nkT}\right)$$

$I_F$: Foward current
$V_F$: Foward voltage
S: Schottky junction area
$A^*$: Effective Richardson constant
T: Absolute temperature
k: Boltzmann constant
q: Electron charge
$\phi_B$: Barrier height.

21. A burn-in method according to claim 18, wherein said temperature sensor is comprised of pn junction diodes, and the parameters for deriving a junction temperature thereof are an applied voltage at a specific junction temperature for a trifle current of a specific value to flow, and a temperature coefficient of the applied voltage, said parameters determined by measuring, with the semiconductor devices unfed, applied voltages for causing the trifle current of the specific value to flow at various environmental temperatures.

22. A burn-in method according to claim 18, wherein said temperature sensor is comprised of transistors, the parameters for deriving junction temperatures of the respective temperature sensors are an applied voltage at a specific junction temperature for causing a trifle current of a specific value, and a temperature coefficient of the applied voltage, and the parameters determined by measuring, with the semiconductor devices unfed, applied voltages for causing the trifle current of the specific value to flow at various environmental temperatures.

23. A burn-in method according to claim 18, wherein said temperature sensor is comprised of a metal film, the parameters for deriving a junction temperature of each temperature sensor are an applied voltage at a specific junction temperature for causing a trifle current of a specific value to flow, and a temperature coefficient of the applied voltage, and the parameters are determined by measuring, with the semiconductor devices unfed, applied voltages for causing the trifle current of the specific value to flow at various environmental temperatures.

* * * * *